United States Patent [19]

McCanney

[11] Patent Number: 4,719,393

[45] Date of Patent: Jan. 12, 1988

[54] DEFLECTION AMPLIFIER

[76] Inventor: Neil R. McCanney, 15406 Timberline Dr., Tampa, Fla. 33624

[21] Appl. No.: 902,637

[22] Filed: Sep. 2, 1986

[51] Int. Cl.$^4$ .................. H01J 29/70; H01J 29/76
[52] U.S. Cl. .................................. 315/397; 315/389
[58] Field of Search ............... 315/397, 396, 403, 389

[56] References Cited

U.S. PATENT DOCUMENTS

| | | |
|---|---|---|
| 3,500,221 | 3/1970 | Mercier . |
| 3,638,130 | 1/1972 | Freeborn . |
| 3,786,303 | 1/1974 | Hilburn . |
| 3,816,792 | 6/1974 | Spencer, Jr. . |
| 4,164,688 | 8/1979 | Cushing ............................ 315/397 |
| 4,297,621 | 10/1981 | Spilsbury . |

Primary Examiner—Theodore M. Blum
Attorney, Agent, or Firm—Sixbey, Friedman & Leedom

[57] ABSTRACT

A deflection amplifier for a CRT display device which generates a sweep ramp by means of a low distortion complimentary push-pull amplifier. The amplifier generates a compliance voltage which is fed back to an initial push-pull differential amplifier input stage and which is also used to generate a current through a deflection yoke coil. A sense resistor in series with the deflection yoke coil operates with a differential amplifier to direct a negative feedback signal to the input for the complimentary push-pull amplifier.

10 Claims, 4 Drawing Figures

DEFLECTION AMPLIFIER

TECHNICAL FIELD

The present invention relates to solid state deflection amplifiers generally, and more particularly to a deflection amplifier for providing a low distortion, highly linear sweep ramp to the CRT display unit for a photocomposing machine.

BACKGROUND ART

Modern photocomposing machines having cathode ray tube display units must be capable of displaying multiple lines of type or graphics during each sweep at high scanning rates. For displays of this type, it is critical that a highly linear deflection signal be provided to the cathode ray tube magnetic deflection yoke and that a high speed retrace capability is maintained to provide a rapid scan. In the past, rapid retrace has been achieved with dual-mode deflection amplifiers which provide a linear mode for forward scanning and a non-linear mode for retrace operation. With amplifiers of this type, the deflection yoke current is controlled to follow an applied input deflection voltage, while in the non-linear mode, the yoke is effectively disconnected from the deflection amplifier output for non-linear retrace. Dual-mode deflection amplifiers are disclosed by U.S. Pat. Nos. 3,786,303 to Hilburn, 3,816,792 to Spencer and 4,297,621 to Spilsburg.

During linear operation, dual-mode and other linear deflection amplifiers, such as the fast response current amplifier illstrated in U.S. Pat. No. 3,500,221 to Mercier, achieve linearity and stability through current and voltage feedback techniques. Basically, a closed loop feedback circuit is provided which includes a current sampling resistor in series with the deflection yoke to provide a voltage proportional to yoke current. This voltage, when compared with an input drive voltage to the amplifier, can be used to cause the yoke current to be a high quality reproduction of the drive voltage.

The known deflection amplifiers operate effectively for some applications to provide a controlled current through the induction yoke of a cathode ray tube electromagnetic deflection system. However, these deflection amplifiers are often not adaptable to provide high speed operation with a high operational current capability, and such amplifiers are often susceptible to error causing common mode non-linearities and the effects of harmonics and thermal drift.

DISCLOSURE OF THE INVENTION

It is a primary object of the present invention to provide a novel and improved deflection amplifier adapted to provide an ultralinear high current output across the deflection yoke of a cathode ray tube display device.

Another object of the present invention is to provide a novel and improved deflection amplifier wherein an active sweep ramp is generated by a highly linear complimentary push-pull amplifier assembly which generates a highly predictable, stable, compliance voltage.

Yet another object of the present invention is to provide a novel and improved deflection amplifier which includes two fully complimentary, push-pull high current amplifiers with two compliance generators configured in a push-pull bridge configuration. The compliance generators provide a compliance voltage at one end of a deflection yoke which swings negative connected by means of base resistors 28 and 30 to the base electrodes of transistors 32 and 34 respectively. Transistor 32 is an NPN transistor which is coupled with an NPN transistor 36 to form a first differential amplifier 38, while transistor 34 is a PNP transistor which is coupled with a second PNP transistor 40 to form a differential amplifier 42. The differential amplifiers 38 and 42 are complementary amplifiers which are connected in a push-pull bridge configuration to form the push-pull amplifier 24. Thus the collectors of the transistors 32 and 35 are connected by means of collector resistors 44 and 46 to a positive power supply terminal, while the emitters of the transistors 34 and 40 are connected by means of emitter resistors 48 and 50 to the same positive power supply terminal. Similarly, the collectors of the transistors 34 and 40 are connected by means of collector resistors 52 and 54 respectively to a negative power supply terminal, while the emitters of the transistors 32 and 36 are connected by means of emitter resistors 56 and 58 respectively to the same negative power supply terminal.

The push-pull amplifiers 24 and 26 each receive a second input from an orthogonality correction circuit, and this input for the amplifier 24 is provided by a differential amplifier 60. Thus the output signal from the differential amplifier 60 is coupled by means of base resistors 62 and 64 to the bases of transistors 36 and 40 for the amplifier 24.

The push-pull amplifier 26 is identical in construction to the amplifier 24, and structural elements in the amplifier 26 which are identical to those in the amplifier 24 will be designated by the same reference numeral followed by the suffix "B". Therefore, it will be noted that the output 22 of the differential amplifier 12 is connected to the base electrodes of the transistors 32B and 34B by base resistors 28B and 30B respectively, while the output while the compliance voltage at the opposite end of the deflection yoke swings positive. This doubles the compliance voltage range, and all common mode non-linearities cancel, even harmonics cancel, and DC balance offsets and thermal drifts also cancel.

A still further object of the present invention is to provide a novel and improved deflection amplifier which includes two fully complementary push-pull high current amplifiers with two compliance voltage generators configured in a push-pull configuration giving rise to greater current capabilities.

BEST MODE FOR CARRYING OUT THE INVENTION

Figure 1:
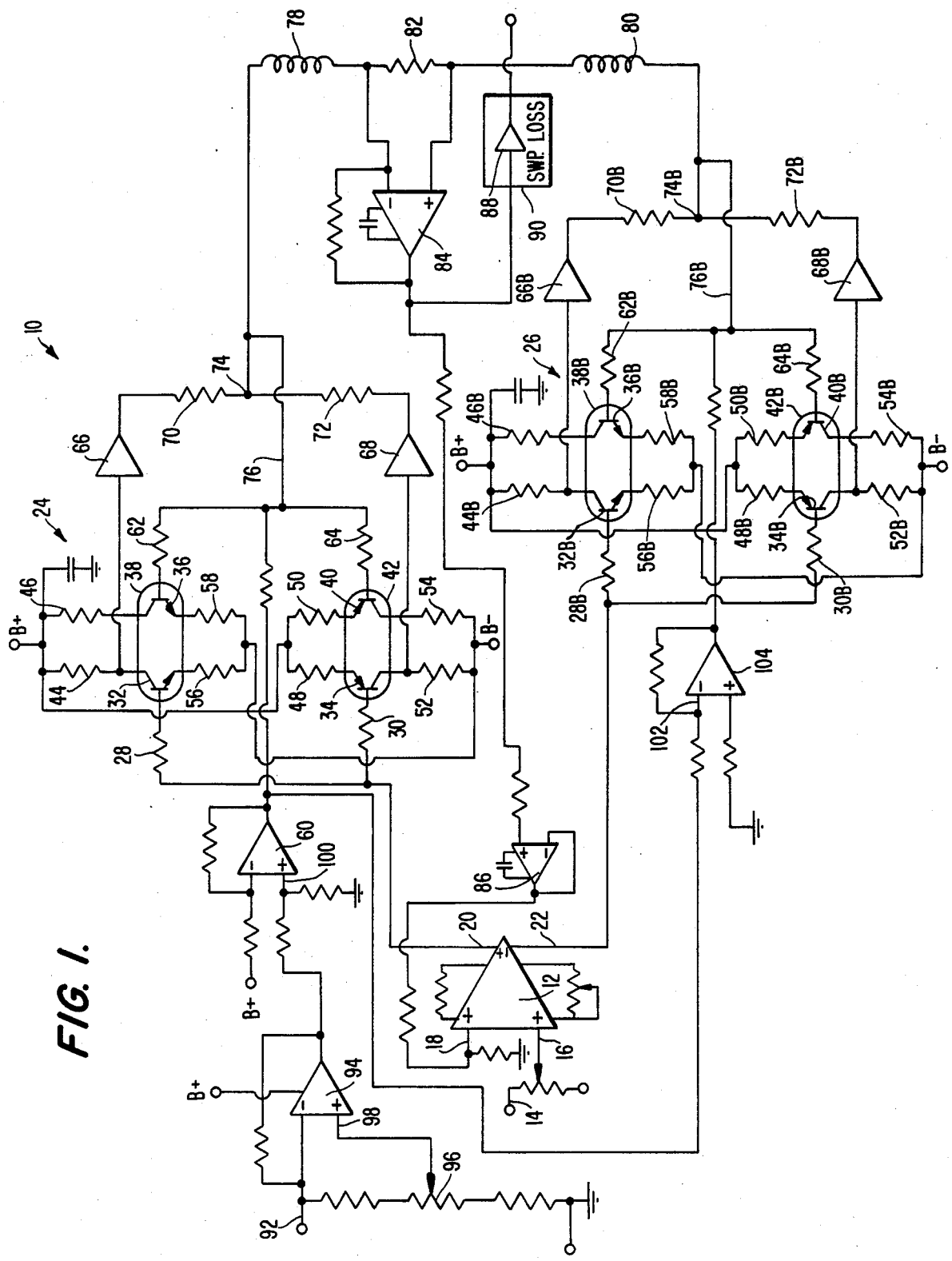
FIG. 1 is a block diagram of the deflection amplifier of the present invention.

Referring to FIG. 1, the deflection amplifier of the present invention indicated generally at 10 includes a differential amplifier 12 which receives a deflection drive input signal from an input 14 on a first amplifier input 16 and an error signal on a second amplifier input 18. The outputs 20 and 22 of the differential amplifier 12 are provided as inputs to two fully complimentary push-pull high current amplifiers 24 and 26.

The output 20 of the differential amplifier 12 is from the differential amplifier 60 is coupled by means of base resistors 62B and 64B to the base of the transistors 36B and 40B.

The push-pull amplifier 24 forms part of a positive compliance voltage generator while the push-pull amplifier 26 forms part of a negative compliance voltage generator. These negative and positive compliance voltage generators are completed by output amplifier sections 66 and 68 and 66B and 68B which receive and amplify the outputs from the differential amplifiers 38 and 40 and 38B and 40B respectively. For purposes of description, the operation and construction of the differential amplifiers 38 and 40 and the output amplifier sections 66 and 68 will be described with the understanding that this description applies to the complementary negative compliance voltage generator formed by the amplifiers 38B and 40B with the output amplifier sections 66B and 68B.

The output from the differential amplifier 38 is taken from the collector of the transistor 32 and is provided as an input to the output amplifier section 66, while the output from the differential amplifier 42 is taken from the collector of the transistor 34 and is provided to the output amplifier section 68. The amplifier sections 66 and 68 provide a push-pull output stage for the positive compliance voltage generator, and the outputs of these amplifier sections are provided across output-resistors 70 and 72 respectively to provide a highly predictable, stable compliance voltage signal at point 74. This compliance voltage signal is fed back over a feedback loop 76 as a base bias for the bases of the transistors 36 and 40.

The output amplifier sections 66B and 68B operate with the push-pull amplifier 26 to provide a precision compliance voltage at point 74B which swings negative as the compliance voltage at point 74 swings positive. These compliance voltages are provided at either end of a deflection yoke which is divided into yoke sections 78 and 80 in series with an intermediate sense resistor 82. A current source is formed using the stable compliance voltages and the current sensing resistor in series with the yoke windings. A differential amplifier 84 having inputs connected to opposite ends of the sense resistor 82 couples a current error signal developed across the sense resistor as a negative feedback signal through an offset amplifier 86 to the second input 18 of the differential amplifier 12.

The current error signal is also directed to an amplifier 88 in a sweep loss detection unit 90. The output of the amplifier 88 is connected to an input terminal 92 for an orthogonality correction differential amplifier 94, the output of which may be varied by adjusting a potentiometer 96 connected between input terminal 92 and a second amplifier terminal 98. The output of the orthogonality correction differential amplifier 94 is provided to an input 100 for the differential amplifier 60. As previously described, the output of the amplifier 60 is directed to the base of the transistors 36 and 40, but additionally, this output is provided to an input terminal 102 for a differential amplifier 104. This differential amplifier 104 provides an output signal to the base of transistors 36B and 40B. Thus the differential amplifiers 94, 60 and 104 form an orthogonality correction circuit for providing correction signals to the push-pull amplifiers 24 and 26.

The deflection amplifier 10 of FIG. 1 generates a sweep ramp by use of complementary push-pull amplifiers, each of which generates a highly predictable, stable compliance voltage from a very low source impedance. Each complementary amplifier is itself a complementary push-pull amplifier configured in a push-pull bridge configuration with each amplifier having its own push-pull output stage. Since the compliance voltage generated by this arrangement swings positive at one end of the deflection yoke and negative at the opposite end, the compliance voltage range is doubled over that produced by a single push-pull compliance generator, and power dissipation in the output stages is shared by four units, thereby giving rise to greater current capability. Overall stability ratios are enhanced since minor bandpass peaks tend to cancel, and DC balance offsets and thermal drifts also cancel. Also, all common mode non-linearities and even harmonics cancel.

Figure 2:
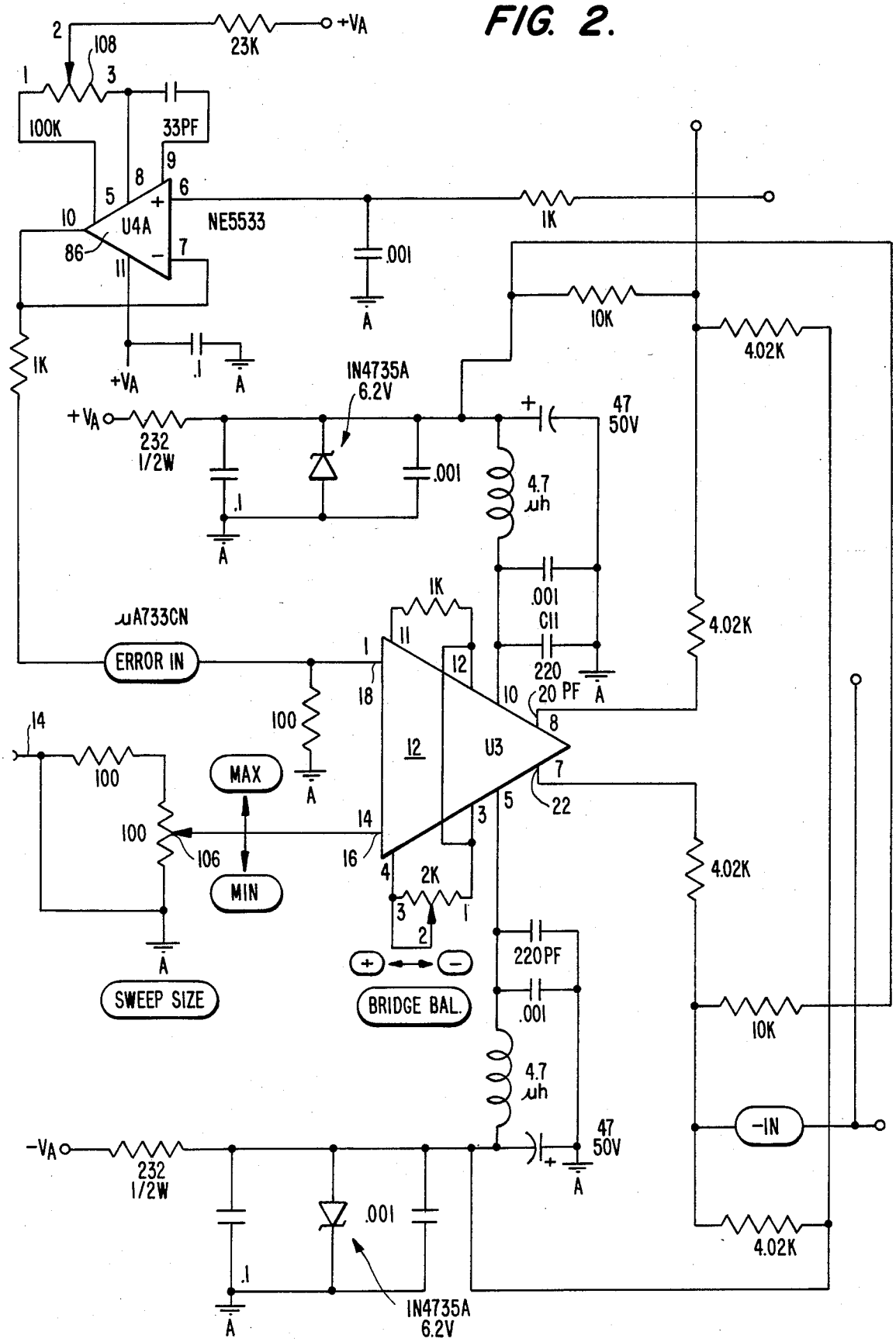
FIG. 2 is a circuit diagram of the input differential amplifier circuit for the deflection amplifier of FIG. 1.

FIG. 2 illustrates in detail the circuit for the differential amplifier 12 and the offset amplifier 86. The deflection drive signal from the deflection drive input terminal 14 may be adjusted by means of a potentiometer 106 to vary the amplitude of the signal provided to the amplifier input 16, thus adjusting the ultimate size of the sweep for the cathode ray tube containing the yoke sections 78 and 80. Also, the system offset may be adjusted by a potentiometer 108 which varies the bias voltage supply to the offset amplifier 86.

Figure 3:
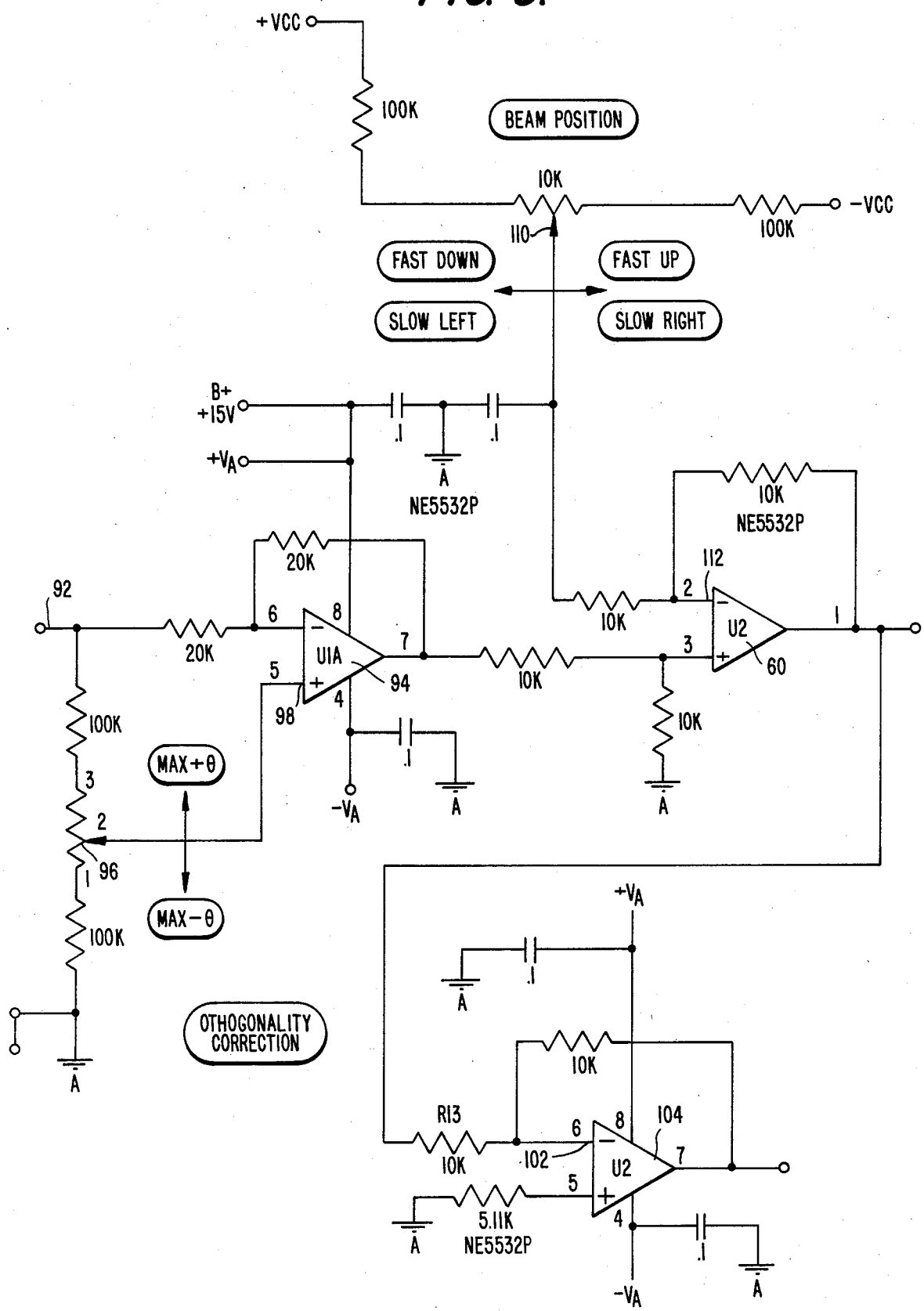
FIG. 3 is a circuit diagram of the orthogonality connection circuit for the deflection amplifier of FIG. 1.

The orthogonality correction circuit of FIG. 3, as previously described, includes the orthogonality correction differential amplifier 94 and the differential amplifiers 60 and 104. The differential amplifier 60 includes a beam position control circuit in the form of a potentiometer 110 which varies the bias on an input 112 for the differential amplifier 60. The output signal from the differential amplifiers 60 and 104 to the push-pull amplifiers 24 and 26 is thus adjusted to provide orthogonality correction and a desired beam position. In FIG. 1, the differential amplifier 60 provides a negative signal to the push-pull amplifier 24 while the differential amplifier 104 provides a positive signal to the differential amplifier 26. These signals are of opposite polarity to the signals from the differential amplifier 12 which provides a positive going signal to the push-pull amplifier 24 and a negative going signal to the push-pull amplifier 26.

Figure 4:
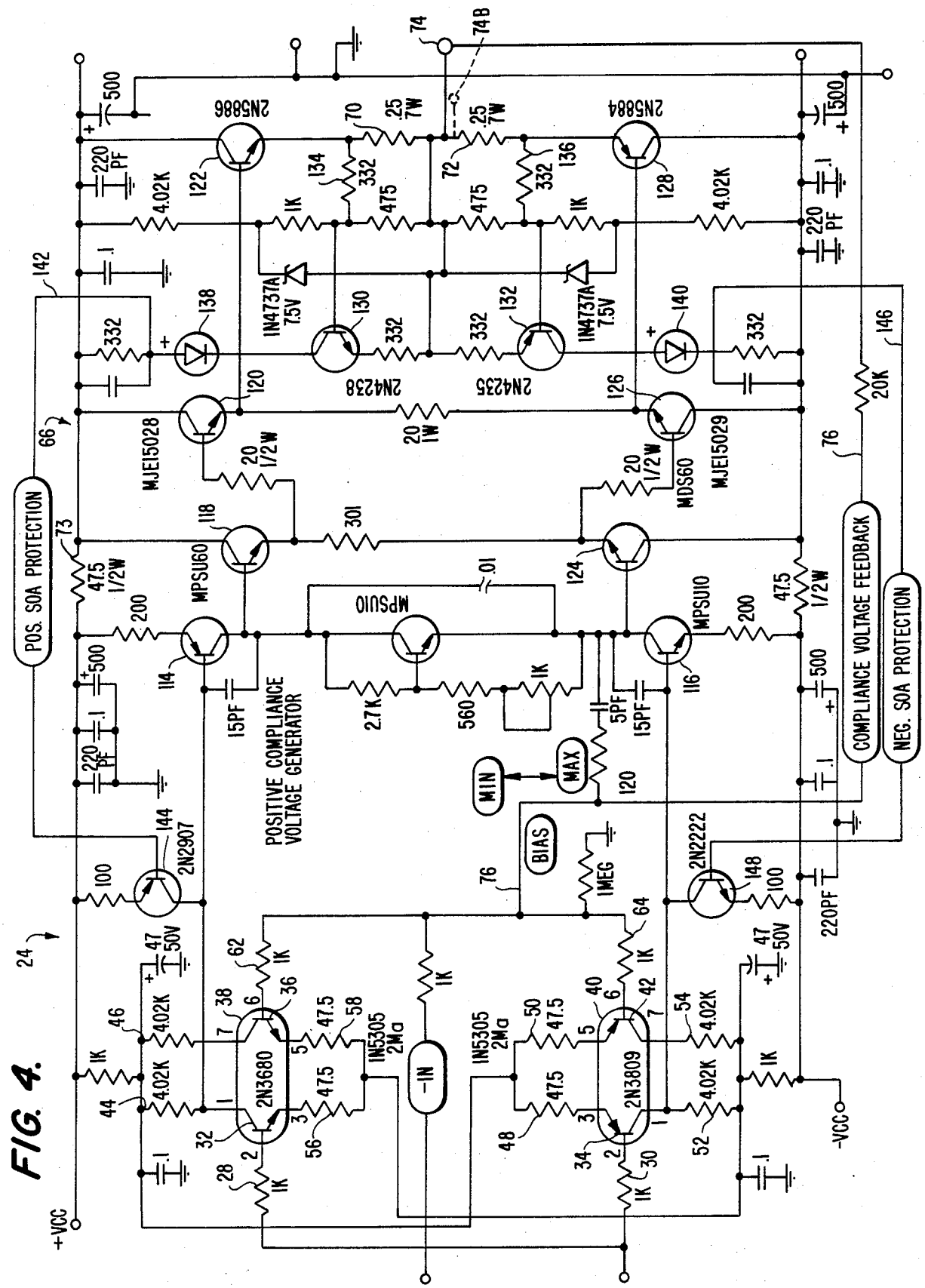
FIG. 4 is a circuit diagram of a push-pull amplifier for the deflection amplifier of FIG. 1.

FIG. 4 illustrates in detail the circuit for the push-pull amplifiers 24 and 26 and the output amplifier sections 66 and 68, and for purposes of illustration, the amplifier 24 and output section 66 are shown. It will be noted that the output of the differential amplifier 38 taken from the collector circuit for the transistor 32 is directed to the base of a transistor 114 in the input stage of the output amplifier section 66 while the output of the differential amplifier 42 taken from the collector circuit for the transistor 34 is directed to the base of a transistor 116 in the input stage of the output amplifier section. The transistor 114 is cascade connected to transistors 118, 120 and 122, while the transistor 116 is connected in cascade with transistors 124, 126 and 128 to complete the push-pull output amplifier section 66. This output amplifier section is provided with a safe operation shutdown sensing unit which senses the emitter current of transistors 122 and 128 and operates to divert the output from the differential amplifiers 38 and 42 when the sensed emitter current exceeds a predetermined safe level. This safe operation shutdown sensing unit includes transistors 130 and 132 with base resistors 134 and 136 connected to the emitters of transistors 122 and 128 respectively. Diodes 138 and 140 are connected in series with the emitter-collector circuits of the transistors 130 and 132 respectively, and in circuit with each such diode is a protective feedback loop. A positive protective feedback loop 142 extends to the base of a shutdown transistor 144 having an emitter-collector circuit connected between the positive power supply terminal for the deflection amplifier 10 and the circuit between the collector of the transistor 32 and the base of the transistor 114. Similarly, a negative protective feedback loop 146 extends to the base of a shutdown transistor 148 having a collector-emitter circuit connected between the negative power supply terminal for the deflection amplifier and the circuit between the collector of the transistor 42 and the base of the transistor 116. Thus the shutdown transistors 144 and 148 may be activated to divert the outputs from the differential amplifiers 38 and 42 away from the output amplifier section 66 when the emitter currents sensed by the transistors 130 and 132 are too high. The single push-pull amplifier 24 of FIG. 4 may be used in combination with the differential amplifier 12 of FIG. 2 to form a deflection amplifier circuit which does not include the push-pull amplifier 26 or the output amplifier sections 66B and 68B. To accomplish this, the positive output 20 from the differential amplifier 12 is connected to the base resistors 28 and 30, while the negative output 22 is connected to the base resistors 62 and 62, replacing the input from the differential amplifier 60. Then, in FIG. 1, only the resistor 70 is connected to the point 74 while the resistor 72 is connected to the point 74B. This is shown in broken lines in FIG. 4. The deflection yoke circuit and feedback circuit of FIG. 1 would remain the same with a single push-pull amplifier 24 connected across points 74 and 74B.

INDUSTRIAL APPLICABILITY

The deflection amplifier 10 of the present invention generates an active sweep ramp by a low distortion, highly linear push-pull amplifier that produces a highly predictable, stable, compliance voltage from a very low source impedance, enhanced by very high ratios of negative feedback in both local, stage-by-stage and intrastage loops. A constant current source is formed using this, now stable, compliance voltage source and a current sensing resistor in series with the deflector yoke winding. An additional differential amplifier stage couples this current error signal back for input into the compliance voltage generators with high ratios of negative feedback. For high deflection currents, the deflection amplifier consists of two fully complimentary, push-pull, high current amplifiers with their attendant local and interstage, compliance voltage feedback loops. These complimentary push-pull amplifiers form two compliance voltage generators configured in a push-pull bridge configuration.

I claim:
1. A deflection amplifier adapted to drive the deflection yoke coil means of a cathode ray tube, said deflection yoke coil means having a first terminal at one end thereof and a second terminal at a second opposed end thereof, said deflection amplifier comprising input means for receiving a deflection input signal and producing first and second complementary output signals indicative thereof, first and second amplifier means connected in a push-pull configuration to receive said complimentary output signals, said first and second amplifier means being connected to said deflection yoke coil means and operative to provide a compliance voltage to said deflection yoke coil means, said first amplifier means being connected to receive said first complementary output signal and to provide a first compliance voltage to said first terminal of the deflection yoke coil means and said second amplifier means being connected to receive said second complementary output signal and to provide a second compliance voltage to the second terminal of said deflection yoke coil means, said first and second compliance voltages being complementary signals, a resistor means connected in series with said deflection yoke coil means to provide a current indicative of said compliance voltage provided to said deflection yoke coil means, negative feedback means connected to said resistor means and operative to generate a negative feedback signal from the current indicative of said compliance voltage, said negative feedback means operating to feed said feedback signal to said input means.

2. A deflection amplifier adapted to drive the deflection yoke coil of a cathode ray tube comprising input means for receiving a deflection input signal and producing complementary output signals indicative thereof, first and second amplifier means connected in a push-pull configuration to receive said complimentary output signals and being connected to said deflection yoke coil and operative to provide a compliance voltage to said deflection yoke coil, said first and second amplifier means each including a differential amplifier means connected to receive one of said complimentary output signals and an output stage amplifier means connected to receive an output signal from a differential amplifier means, said output stage amplifier means operating to provide said compliance voltage from said differential amplifier output signals, and compliance voltage feedback means operative to receive the compliance voltage from said output stage amplifier means, said compliance voltage feedback means operating to provide said compliance voltage to said differential amplifier means, a resistor means connected in series with said deflection yoke coil to provide a current indicative of said compliance voltage, negative feedback means connected to said resistor means and operative to generate a negative feedback signal from the current indicative of said compliance voltage, said negative feedback means operating to feed said feedback signal to said input means.

3. A deflection amplifier adapted to drive the deflection yoke coil of a cathode ray tube comprising input means for receiving a deflection input signal and producing complementary output signals indicative thereof, first and second amplifier means connected in a push-pull configuration to receive said complimentary output signals, said first and second amplifier means being connected to said deflection yoke coil and operative to provide a compliance voltage to said deflection yoke coil, said first and second amplifier means being connected in a complementary push-pull bridge configuration, each such first and second amplifier means including first and second differential amplifier means connected in a complementary push-pull bridge relationship and first and second output stage amplifier means connected respectively to each said first and second differential amplifier means, respectively, said first differential amplifier means operating to provide an output signal to said first output stage amplifier means and said second differential amplifier means operating to provide an output signal to said second output stage amplifier means, a resistor means connected in series with said deflection yoke coil to provide a current indicative of said compliance voltage, negative feedback means connected to said resistor means and operative to generate a negative feedback signal from the current indicative of said compliance voltage, said negative feedback means operating to feed said feedback signal to said input means.

4. The deflection amplifier of claim 3, wherein said first and second output stage amplifier means are connected in push-pull relationship, said first and second output stage amplifier means being operative to provide a compliance voltage to said deflection yoke coil, and compliance voltage feedback means connected to receive the compliance voltage from said first and second output stage amplifier means and to provide said compliance voltage to said first and second differential amplifiers.

5. The deflection amplifier of claim 4, wherein said first and second output stage amplifier means each provide an output current to a compliance voltage forming means, and a first safe operation shutdown means is connected to sense the amplitude of the output current from said first output stage amplifier means, said first safe operation shutdown means operating when the amplitude of the output current from said first output stage amplifier means exceeds a preset safe amplitude level to terminate provision of the output signal by said first differential amplifier means to said first output stage amplifier means, and a second safe operation shutdown means is connected to sense the amplitude of the output current from said second output stage amplifier means, said second safe operation shutdown means operating when the output current from said second stage amplifier means exceeds a preset safe amplitude level to terminate provision of the output signal by said second differential amplifier means to said second output stage amplifier means.

6. The deflection amplifier of claim 2, wherein a first output stage amplifier means is connected to receive an output signal from a first differential amplifier means for said first amplifier means and a second output stage amplifier means is connected to receive an output signal from a second differential amplifier means for said second amplifier means, said first and second differential amplifier means being connected in complementary push-pull bridge relationship.

7. The deflection amplifier of claim 6, wherein said first and second output stage amplifier means each provide an output current to a compliance voltage forming means, and a first safe operation shutdown means is connected to sense the amplitude of the output current from said first output stage amplifier means, said first safe operation shutdown means operating when the amplitude of the output current from said first output stage amplifier means exceeds a preset safe amplitude level to terminate provision of the output signal by said first differential amplifier means to said first output stage amplifier means, and a second safe operation shutdown means is connected to sense the amplitude of the output current from said second output stage amplifier means, said second safe operation shutdown means operatng when the output current from said second stage amplifier means exceeds a preset safe amplitude level to terminate provision of the output signal by said second differential amplifier means to said second output stage amplifier means.

8. The deflection amplifier of claim 3, which includes orthogonality correction means operative to provide complementary orthogonality correction signals to the first and second differential amplifier means of each said first and second amplifier means.

9. The deflection ampliifer of claim 1, wherein said deflection yoke coil means includes a first coil section connected to said first terminal and a second coil section connected to said second terminal, said resistor means being connected between said first and second coil sections.

10. The deflection amplifier of claim 1, wherein said first and second amplifier means are connected in a complementary push-pull bridge configuration, each such first and second amplifier means including first and second differential amplifier means connected in a complementary push-pull bridge relationship.

* * * * *